United States Patent
Koyama et al.

(10) Patent No.: US 6,791,115 B2
(45) Date of Patent: Sep. 14, 2004

(54) LIGHT EMITTING DEVICE, DISPLAY DEVICE AND ELECTRONIC INSTRUMENT

(75) Inventors: Tomoko Koyama, Suwa (JP); Takeo Kaneko, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 16 days.

(21) Appl. No.: 10/090,755

(22) Filed: Mar. 6, 2002

(65) Prior Publication Data

US 2002/0125487 A1 Sep. 12, 2002

(30) Foreign Application Priority Data

Mar. 9, 2001 (JP) ........................................ 2001-066612
Mar. 6, 2002 (JP) ........................................ 2002-060135

(51) Int. Cl.[7] .......................... H01L 27/15; H01L 31/12; H01L 33/00
(52) U.S. Cl. .............................. 257/79; 257/87; 257/94; 257/99
(58) Field of Search ....................... 257/79–103; 438/22, 438/24, 46–47; 372/43–50

(56) References Cited

U.S. PATENT DOCUMENTS

| | | | | |
|---|---|---|---|---|
| 4,766,471 A | * | 8/1988 | Ovshinsky et al. ............ | 257/53 |
| 5,164,949 A | * | 11/1992 | Ackley et al. ................. | 372/45 |
| 5,295,147 A | * | 3/1994 | Jewell et al. .................. | 372/45 |
| 6,031,243 A | * | 2/2000 | Taylor ........................... | 257/13 |
| 6,320,206 B1 | * | 11/2001 | Coman et al. ................. | 257/94 |
| 6,340,826 B1 | * | 1/2002 | Iliadis .......................... | 257/292 |

FOREIGN PATENT DOCUMENTS

| | | |
|---|---|---|
| JP | A 63-70257 | 3/1988 |
| JP | A 63-175860 | 7/1988 |
| JP | A 2-135359 | 5/1990 |
| JP | A 2-135361 | 5/1990 |
| JP | A 3-152184 | 6/1991 |
| JP | A 8-248276 | 9/1996 |
| JP | A 10-153967 | 6/1998 |

* cited by examiner

Primary Examiner—Shouxiang Hu
(74) Attorney, Agent, or Firm—Oliff & Berridge, PLC (57) ABSTRACT

A light emitting device has a substrate and a light-emitting section formed on the substrate. The light-emitting section includes a light-emitting layer in which light is generated by electro-luminescence, first and second electrodes used to apply electric charges to the light-emitting layer, and first and second dielectric multi-layered films between which the light-emitting layer is interposed. The first and second electrodes are disposed to avoid overlap with a light-emitting region in the light-emitting layer as viewed from a light emitting direction.

7 Claims, 10 Drawing Sheets

LIGHT EMITTING DEVICE, DISPLAY DEVICE AND ELECTRONIC INSTRUMENT

Japanese Patent Application No. 2001-66612, filed on Mar. 9, 2001, and Japanese Patent Application No. 2002-60135 filed on Mar. 6, 2002 are herein incorporated by reference in their entirety.

BACKGROUND OF THE INVENTION

The present invention relates to a surface-emitting type of light emitting device using electro-luminescence (EL), and a display device and an electronic instrument using the light emitting device.

In an EL light emitting element using EL, isotropic light emission deteriorates the directivity so that the intensity of a light in a specific direction is low, and the emitted light cannot be utilized at high efficiency.

BRIEF SUMMARY OF THE INVENTION

The present invention may provide a light emitting device that is superior in wavelength selectivity of light to be emitted in a direction intersecting a substrate and capable of efficiently utilizing light.

The present invention may also provide a display device and an electronic instrument using the light emitting device.

According to one aspect of the present invention, there is provided a light emitting device having a substrate and a light-emitting section provided on the substrate, and emitting light in a direction intersecting the substrate, wherein the light-emitting section comprises:

a light-emitting layer in which light is generated by electro-luminescence;

an electrode used to apply electric charges to the light-emitting layer; and first and second dielectric multi-layered films between which the light-emitting layer is interposed; and wherein the electrode is disposed to avoid overlap with at least part of a light-emitting region in the light-emitting layer, as viewed from a light emitting direction.

The first and second dielectric multi-layered films of this light emitting device enables to improve the wavelength selectivity. As a result, the light generated in the light-emitting layer by electro-luminescence emits at high efficiency in a narrow wavelength band corresponding to a high reflectance band of the first and second dielectric multi-layered films. In addition, since the electrode is disposed to avoid overlap with the light-emitting region in the light-emitting layer as viewed from the light emitting direction, absorption or scattering of light due to the electrode can be reduced. Therefore, the light generated in the light-emitting layer can be utilized at high efficiency.

"The electrode is disposed to avoid overlap with the light-emitting region in the light-emitting layer as viewed from the light emitting direction" means to dispose the electrode so that the light generated in the light-emitting region of the light-emitting layer is not obstructed by the electrode as much as possible during transmission of the light between the first and second dielectric multi-layered films. More concretely, the electrode is not provided in a place overlapping the entirety or part of the light-emitting region as viewed from a direction in which the dielectric multi-layered films are piled (or a direction intersecting a surface of the substrate).

The present invention has various features as follows.

(A) As the electrode, the light emitting device may comprise: a first electrode formed of a pair of electrode layers used to apply electrons to the light-emitting layer; and a second electrode formed of a pair of electrode layers used to apply holes to the light-emitting layer. In this configuration, since the first and second electrodes respectively comprise a pair of electrode layers, one of a pair of the electrode layers can be used as a so-called source, while the other can be used as a so-called drain. The "source" is a region which supplies electrons and the "drain" is a region which supplies holes, for example. Accordingly, holes can be led to a hole transport layer from the drain to the source by applying a voltage so that the drain has positive potential to the source. Similarly, electrons can be led to an electron transport layer from the source to the drain by applying a voltage so that the source has negative electric potential to the drain.

(B) The first electrode may be connected to an electron transport layer and the second electrode may be connected to a hole transport layer This configuration enables to apply a predetermined voltage to the electron transport layer by using the first electrode, and apply a predetermined voltage to the hole transport layer by using the second electrode. Since voltage can be separately applied to the electron transport layer and the hole transport layer, a large number of electrons and holes can be transported.

(C) The light emitting device may further comprise: a third electrode disposed to interpose an insulating layer between the first electrode and the third electrode; and a fourth electrode disposed to interpose another insulating layer between the second electrode and the fourth electrode. The third and fourth electrodes may have a function as a gate for the first and second electrodes. For example, by applying a predetermined voltage to the third and fourth electrodes, the electron transport layer and the hole transport layer can be made to have different potentials, resulting that a lot of electrons in the electronic transport layer and a lot of holes in the hole transport layer can be moved into the light-emitting layer. Thus, the number of the electrons and holes contributing to light emission in the light-emitting layer can be increased, and the light emission efficiency can be raised.

(D) The first and second electrodes may be disposed as follows.

First, the first electrode may be disposed on one side of the light-emitting layer and the second electrode may be disposed on the other side of the light-emitting layer, in the direction intersecting the substrate or the light emitting direction.

Second, the first electrode may be disposed on one side of the light-emitting layer and the second electrode may be disposed on the other side of the light-emitting layer, in a direction parallel to a surface of the substrate.

(E) A wavelength band of a light reflected on the first and second dielectric multi-layered film may be included in a wavelength band of a light generated in the light-emitting layer. In this configuration, the first and second dielectric multi-layered films can form a so-called optical resonator. The light is emitted from a film having lower reflectance in the pair of the dielectric multi-layered films.

The light emitting device according to the present invention can be applied to a display device. This display device can be applied to various types of electronic instruments. Alternatively, the light emitting device according to the present invention can be applied to various types of electronic instruments. Examples of such display device and electronic instruments will be described later.

Now, part of examples of materials usable for each component of the light emitting device according to the invention will be described below. It should be understood that these materials are part of known materials, and it goes without saying that materials other than these examples can be similarly used.
Light-emitting Layer A material for the light-emitting layer is selected among well-known chemical compounds in order to obtain the light having a predetermined wavelength. It may be either of organic and inorganic compounds, but preferably, is an organic compound in view of a profusion of kinds and a characteristic of forming a film.

It is possible to use such organic compound as aromatic diamine derivative (TPD), oxadiazole derivative (PBD), oxadiazole dimer (OXD-8), distyryl arylene derivative (DSA), beryllium-benzquinolinol complex (Bebq), triphenyl amine derivative (MTDATA), rubrene, quinacridone, triazole derivative, polyphenylene, polyalkylfluorene, polyalkylthiophene. azomethine zinc complex, porphyrin zinc complex, benzoxazole zinc complex and phenanthroline europium. which are disclosed in, for example, the Japanese Patent Application Laid-Open No. 10-153967.

More concretely, the material of the organic light-emitting layer to be used can be such well-known material that is disclosed in the Japanese Patent Application Laid-Open No. 63-70257, the Japanese Patent Application Laid-Open No. 63-175860, the Japanese Patent Application Laid-Open No. 2-135361, the Japanese Patent Application Laid-Open No. 2-135359, the Japanese Patent Application Laid-Open No. 3-152184, the Japanese Patent Application Laid-Open No. 8-248276 or the Japanese Patent Application Laid-Open No. 10-153967. These compounds may be used single or in combination of two or more kinds.

ZnS:Mn (in red area), ZnS:TbOF (in green area), SrS:Cu, SrS:Ag and SrS:Ce (in blue area) are exemplified as the inorganic compound.
Dielectric Multi-layered Film In the light-emitting section, the dielectric multi-layered film has a structure where materials whose refractive indices are different each other are piled alternately. In such a piled layer structure, a layer of silicon oxide ($SiO_2$) and a layer of silicon nitride ($SiN_x$), for example, are piled alternately. Alternatively, two layers selected among $TiO_2$, $Ta_2O_5$, $MgF_2$ and ZnS, for example, may be piled alternately to form the dielectric multi-layered film.
Electrode Layer An electron applying type of metal, an alloy and an electricity conductive type of compound, which have a small work function (not more than 4 ev, for example), and compound thereof may be used for a cathode, that is, an electrode for applying electrons to the light-emitting layer. Such electrode material to be used may be the one disclosed in the Japanese Patent Application Laid-Open No. 8-248276, for example.

A metal, an alloy and an electricity conductive type of compound, which have a large work function (not lower than 4 eV, for example), and compound thereof may be used for an anode, that is, an electrode for applying holes to the light-emitting layer. In the case that an optically transparent material is used as the anode, a conductive transparent material such as CuI, ITO, SnO, and Zno can be used. When the transparence is not required, a metal such as gold can be used.

It is preferable that the following relation is established for the first electrode connected to the electron transport layer:

Work function of one electrode layer (source)>Lowest unoccupied molecular orbital (LUMO) of the electron transport layer<Work function of the other electrode layer (drain)

Furthermore, it is preferable that the following relation is established for the second electrode connected to the hole transport layer:

Work function of one electrode layer (source)<Highest Occupied molecular orbital (HOMO) of the hole transport layer<Work function of the other electrode layer (drain)

The third and fourth electrodes are not especially limited so long as they are conductive layers having a function as the aforementioned gate for the first and second electrodes. When the third and fourth electrodes form a dielectric multi-layered film, however, it is required that their materials satisfy the characteristic of the film.
Hole Transport Layer A material for the hole transport layer provided in accordance with requirements may be selected for use from materials used as a hole applying material for a well-known optical conductive material or from well-known materials used for a hole applying layer of an organic light emitting device. The material for the hole transport layer has one of functions for applying holes and for providing an electron barrier, and may be either organic or inorganic. Concretely, exemplified is the material disclosed in the Japanese Patent Application Laid-Open No. 8-248276, for example.
Electron Transport Layer A material for the electron transport layer provided in accordance with requirements, which is only required to have a function of transporting to the organic light-emitting layer electrons applied from the cathode, may be selected from well-known materials. Concretely, exemplified is the material disclosed in the Japanese Patent Application Laid-open No. 8-248276, for example.

Further, each layer of the light emitting device can be formed in the well-known manner. For example, an optimal film-forming method can be selected for a material of each layer of the light emitting device. Concretely, vacuum evaporation, spin coating, LB or an inkjet method can be selected, for example.

DETAILED DESCRIPTION OF THE EMBODIMENT

1. First Embodiment 1.1 Device Structure

Figure 1:
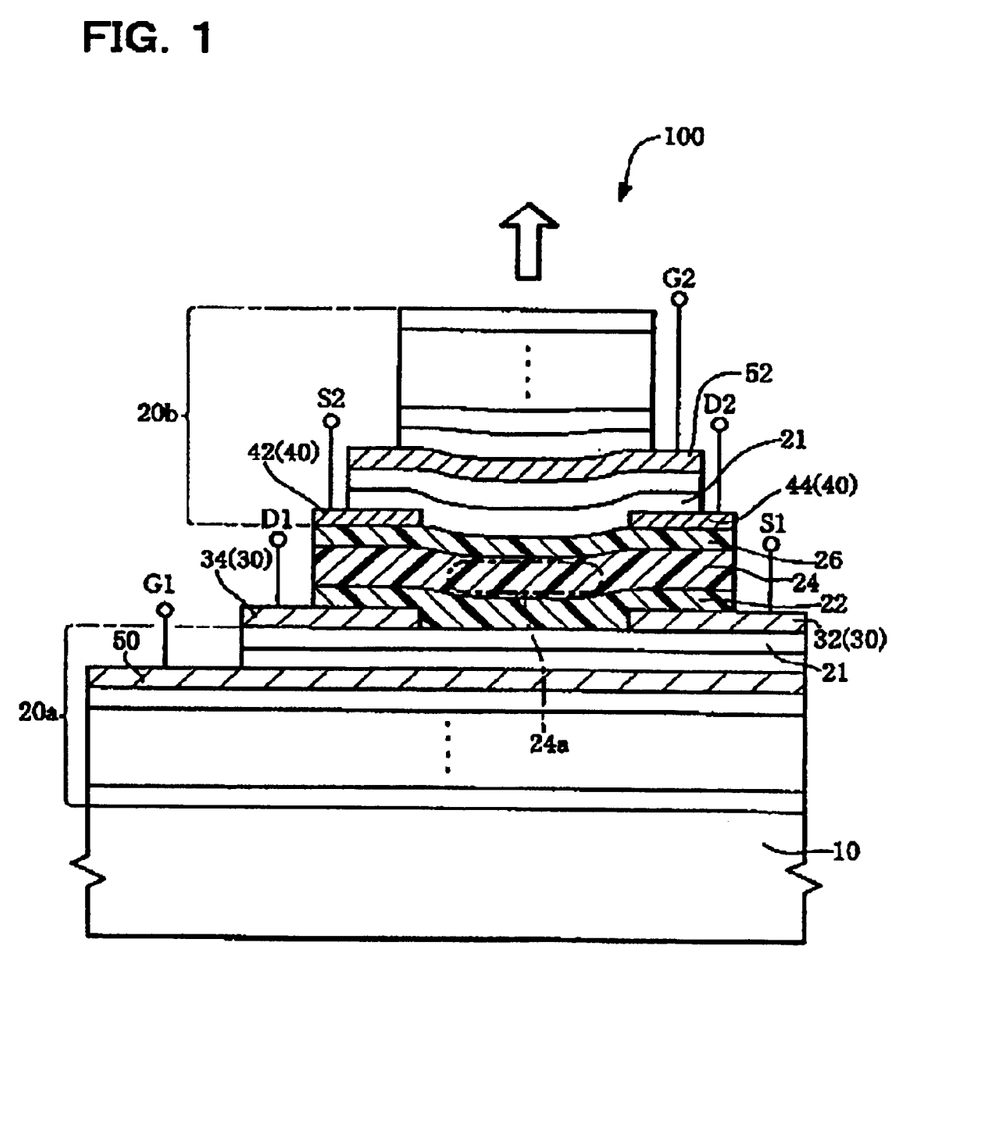
FIG. 1 is a cross-sectional view schematically showing a light emitting device according to the first embodiment of the present invention.

FIG. 1 is a cross-sectional view schematically showing a light emitting device 100 according to the first embodiment of the present invention.

The light emitting device 100 includes a light-emitting section on a substrate 10. The light-emitting section comprises a first dielectric multi-layered film 20a, an electron transport layer 22, a light-emitting layer 24, a hole transport layer 26 and a second dielectric multi-layered film 20b, which are piled in order.

The first dielectric multi-layered film 20a is provided thereon with a first electrode 30 consisting of a pair of electrode layers 32 and 34 for applying electrons to the electron transport layer 22. In this embodiment, one electrode layer 32 works as a source (S1) and the other electrode layer 34 works as a drain (D1). The electrode layers 32 and 34 are spaced each other, so that electrons are applied to the electron transport layer 22 by applying a predetermined voltage to the electrodes 32 and 34.

Further, the hole transport layer 26 is provided thereon with a second electrode 40 consisting of a pair of electrode layers 42 and 44 for applying holes to the hole transport layer 26. In this embodiment, one electrode layer 42 works as a source (S2) and the other electrode layer 44 works as a drain (D2). The electrode layers 42 and 44 are spaced each other, so that holes are applied to the hole transport layer 26 by applying a predetermined voltage to the electrodes 42 and 44.

Accordingly, the electrode layers 32, 34 and 42, 44 forming respectively the first and second electrodes 30 and 40 are disposed so as not to overlap a light-emitting region 24a of the light-emitting layer 24 in the direction that the light emits, which is shown by an arrow in FIG. 1.

The light-emitting layer 24 is formed from a material generating a light by means of an electro-luminescence. The aforementioned materials may be used for the light-emitting layer 24, the electron transport layer 22 and the hole transport layer 26.

In a direction perpendicular to the substrate 10, the electron transport layer 22, the light-emitting layer 24 and the hole transport layer 26 are interposed between the first and second dielectric multi-layered films 20a and 20b.

The first and second dielectric multi-layered films 20a and 20b have a structure in which materials having different refractive indices are piled alternately like a piled layer consisting of a layer of silicon oxide and a layer of silicon nitride, for example. Each of such alternately piled layers is formed to be about $\lambda/4n$ (wherein $\lambda$ denotes a predetermined wavelength in a wavelength band of a light generated in the light-emitting layer 24) in thickness.

The first and second dielectric multi-layered films 20a and 20b reflect a light in a predetermined wavelength band. The wavelength band of a light reflected on the first and second dielectric multi-layered films 20a and 20b is defined on the basis of the wavelength band of a light generated in the light-emitting layer 24. That is, the first and second dielectric multi-layered films 20a and 20b are formed so that the wavelength band of the light reflected thereon is included in that of the light generated in the light-emitting layer 24. In this structure, in the light generated in the light-emitting layer 24, only the light having the wavelength in a high reflectance band of the first and second dielectric multi-layered films 20a and 20b is selectively reflected. As a result, the light can emit with a narrow width of spectrum at a high light-emission efficiency. The wavelength band of the light reflected on the first and second dielectric multi-layered films 20a and 20b is preferably almost identical to that of the light generated in the light-emitting layer 24 in order to further raise the light-emission efficiency.

In this embodiment of the invention, the reflectance of the second dielectric multi-layered film 20b is set smaller than that of the first dielectric multi-layered film 20a. Thus, the light emits from the side of the second dielectric multi-layered film 20b. The reflectance of a pair of dielectric multi-layered films is set properly in accordance with the desirable direction that the light emits.

Further, a third electrode 50 is provided so as to face to the first electrode 30 (the electrode layers 32, 34) with a dielectric layer 21, which forms the first dielectric multi-layered film 20a, intervening therebetween. Similarly, a fourth electrode 52 is provided so as to face to the second electrode 40 (the electrode layers 42, 44) with a dielectric layer 21, which forms the second dielectric multi-layered film 20b, intervening therebetween.

Both of these third and fourth electrodes 50 and 52 form the layers of the dielectric multi-layered films 20a and 20b. Namely, the third and fourth electrodes 50 and 52 have the refractive indices and optical film thickness required for the dielectric multi-layered films 20a and 20b, as well as conductivity. Materials for these electrodes 50 and 52 are not especially limited so long as the above requirements are satisfied, and may be ITO, for example, for use.

1.2 Device Operation and Effects

In the light emitting device 100 in this embodiment, the light emits in accordance with the following mechanism.

A large number of electrons can be applied to the electron transport layer 22 by applying a predetermined voltage to the electrode layer (source) 32 and the electrode layer (drain) 34 of the first electrode 30. A large number of holes can be applied to the hole transport layer 26 by applying a predetermined voltage to the electrode layer (source) 42 and the electrode layer (drain) 44 of the second electrode 40. That is, applying a voltage so that the drain has a positive potential for the source can introduce a large number of holes into the hole transport layer 26 from the drain to the source. On the other hand, applying a voltage so that the source has a negative potential for the drain can introduce electrons into the electron transport layer 22 from the source to the drain.

Moreover, applying a predetermined voltage to the third electrode 50 and the fourth electrode 52 can cause the electron transport layer 22 and the hole transport layer 26 to have potential difference, which results in transportation to the light-emitting layer 24 of a large number of electrons in the electron transport layer 22 and holes in the hole transport layer 26. Therefore, the numbers of electrons and holes contributing to light emission in the light-emitting layer 24 can be increased, and thereby, the light emission efficiency can be raised.

In this embodiment of the invention, the first electrode 30 is connected to the electron transport layer 22, while the second electrode 40 is connected to the hole transport layer 26. Therefore, the voltage can be separately applied to the electron transport layer 22 and the hole transport layer 26, respectively, so that, in this view also, a number of electrons and holes can be transported.

Thus, excitons are generated by combining in the light-emitting layer 24 the electrons applied to the electron transport layer 22 and the holes applied to the hole transport layer 26, and then, light is generated when the excitons are deactivated.

The light generated in the light-emitting layer 24 is increased in wavelength selectivity through an optical resonator comprising a pair of the dielectric multi-layered films 20a and 20b. As a result, the light generated in the light-emitting layer 24 by means of the electro-luminescence emits at a high efficiency in a narrow wavelength band corresponding to the wavelength of the optical resonator.

Furthermore, in accordance with the light emitting device 100, the first and second electrodes 30 and 40 are disposed so as not to overlap the light-emitting region 24a of the light-emitting layer 24 in the direction that the light emits. As a result, the absorption and scattering of light caused by the electrode layers 32, 34 and 42, 44 forming the first and second electrodes 30 and 40 can be reduced, so that the light generated in the light-emitting layer 24 can be utilized at high efficiency.

2. Second Embodiment 2.1 Device Structure

Figure 2:
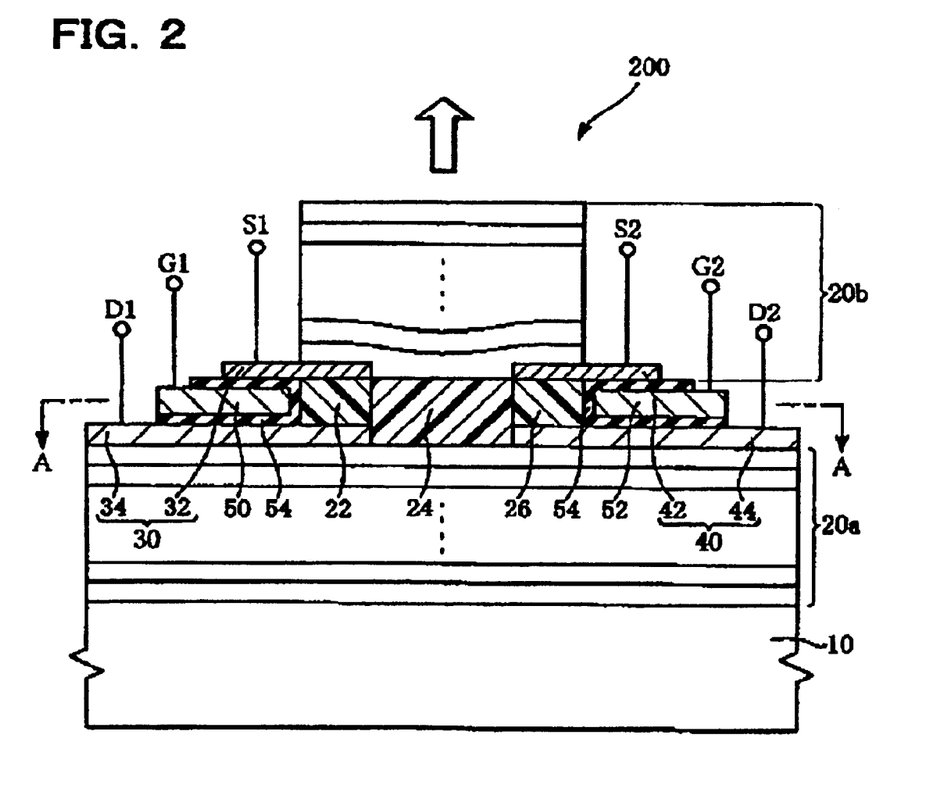
FIG. 2 is a cross-sectional view schematically showing a light emitting device according to the second embodiment of the present invention.
Figure 3:
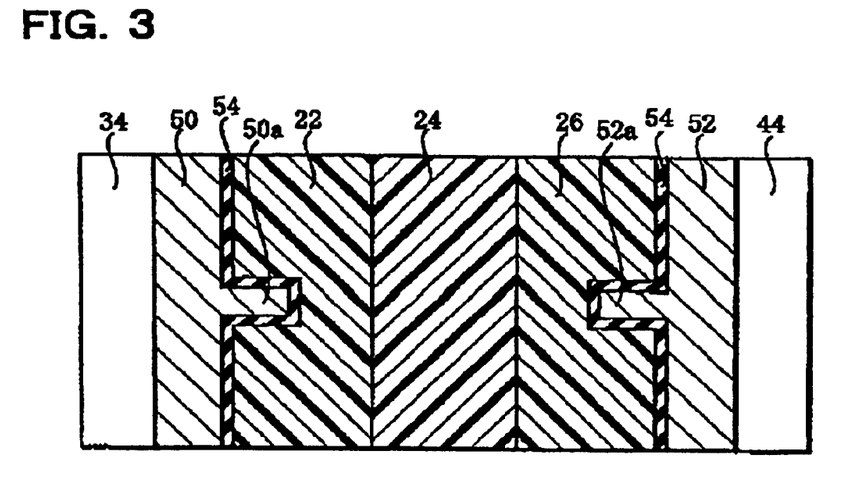
FIG. 3 is a sectional view taken along the line A—A of FIG. 2.

FIG. 2 is a cross-sectional view showing a light emitting device 200 according to the second embodiment of the present invention. FIG. 3 is a sectional view taken along the line A—A of FIG. 2, showing a main component. Disposition of the electron transport layer, the light-emitting layer and the hole transport layer is different from that of the first embodiment. The description below mainly concentrates on the differences between the first and second embodiments, and components having substantially the same functions as the components of FIG. 1 are denoted by the same reference numbers.

The light emitting device 200 includes a light-emitting section on a substrate 10. The light-emitting section comprises a first dielectric multi-layered film 20a, a light-emitting layer 24 and a second dielectric multi-layered film 20b, which are piled in order. In a direction parallel to a surface of the substrate 10, provided is an electron transport layer 22 on one side of the light-emitting layer 24 and a hole transport layer 26 on the other side.

A pair of electrode layers 32 and 34 (a first electrode 30) is provided on the top and the bottom surfaces of the electron transport layer 22 for applying electrons to the electron transport layer 22. In this embodiment, one electrode layer 32 works as a source (S1) and the other electrode layer 34 works as a drain (D1). Thus, applying a predetermined voltage to the electrodes 32 and 34 causes electrons to be applied to the electron transport layer 22.

Further, a pair of electrode layers 42 and 44 (a second electrode 40) is provided on the top and the bottom surfaces of the hole transport layer 26 for applying holes to the hole transport layer 26. In this embodiment of the invention, one electrode layer 42 works as a source (S2) and the other electrode layer 44 works as a drain (D2). Thus, applying a predetermined voltage to the electrodes 42 and 44 causes holes to be applied to the hole transport layer 26.

Accordingly, the electrode layers 32, 34 and 42, 44 forming respectively the first and second electrodes 30 and 40 are disposed so as not to overlap the light-emitting layer 24 in the direction that the light emits, which is shown by an arrow in FIG. 2.

Further, a third electrode 50 is provided outside the electron transport layer 22 (on the opposite side of the light-emitting layer 24) with an insulating layer 54 inserted therebetween. The third electrode 50 is electrically separated through the insulating layer 54 from the electrode layers 32 and 34 forming the first electrode 30. Similarly, a fourth electrode 52 is provided outside the hole transport layer 26 (on the opposite side of the light-emitting layer 24) with an insulating layer 54 inserted therebetween. The fourth electrode 52 is electrically separated through the insulating layer 54 from the electrode layers 42 and 44 forming the second electrode 40.

The third and fourth electrodes 50 and 52 respectively include projecting portions 50a and 52a, which enter into the electron transport layer 22 and the hole transport layer 26, as shown in FIG. 3. Such projecting portions 50a and 52a enable a voltage to be selectively applied only to the center part of the light-emitting layer 24, so that light emission can be concentrated at the center part. Therefore, absorption of the light in the first electrode 30 and the second electrode 40 can be reduced, which further raises the light emission efficiency.

Description of the first and second dielectric multi-layered films 20a and 20b is omitted here since they are same as those of the first embodiment.

2.2 Device Operation and Effects

The light emitting device 200 in this embodiment of the invention basically has the same operation and effects as those of the first embodiment. Therefore, only operation and effects in this embodiment different from those of the first embodiment will be now described.

That is, in this embodiment of the invention, in addition to the effects in the first embodiment, the third electrode 50 and the fourth electrode 52 working as a gate are connected through a thin insulating layer 54 to the electron transport layer 22 and the hole transport layer 26, so that electrons and holes can be effectively transported at a low gate voltage.

2.3 Modification

Figure 4:
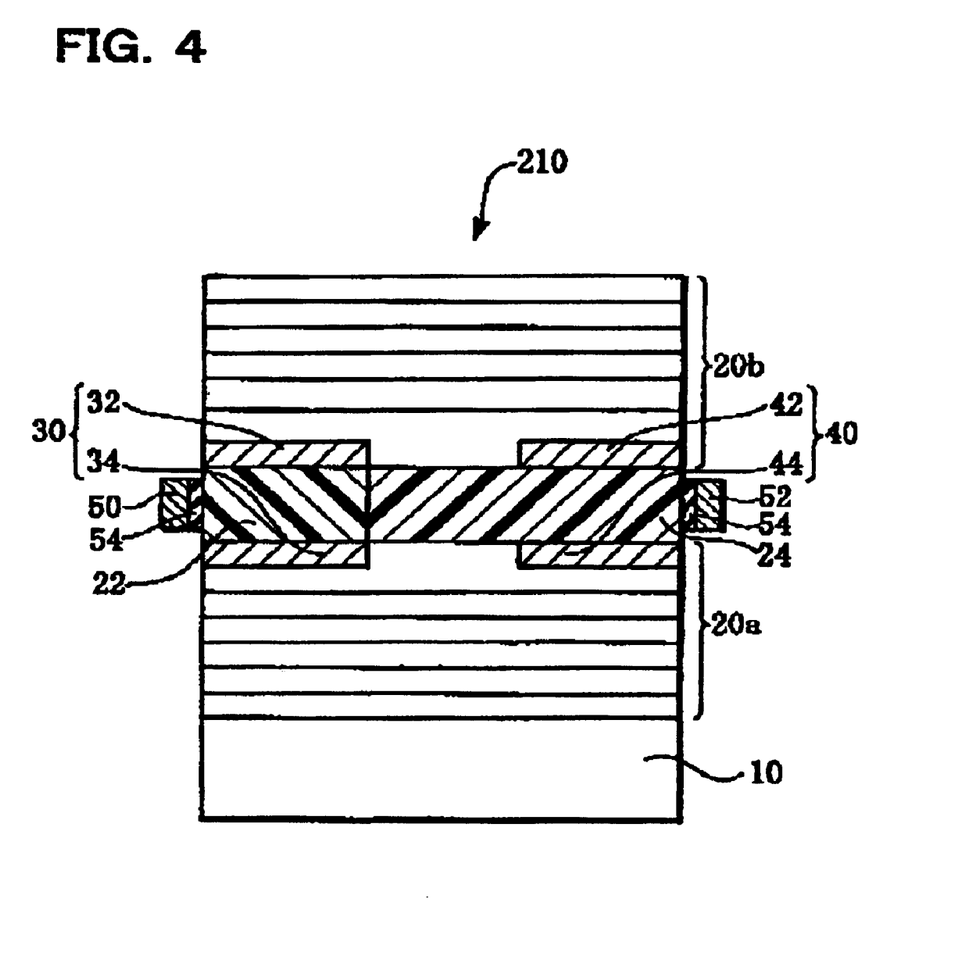
FIG. 4 is a cross-sectional view schematically showing a modification of a light emitting device according to the second embodiment of the present invention.

FIG. 4 is a sectional view of a modification of a light emitting device in the second embodiment. Members having the substantially same functions as those of FIGS. 2 and 3 are marked with the same reference numbers and their detailed description will be omitted here. A light emitting device 210 in this modification is same as the light emitting device 200 shown in FIGS. 2 and 3 except that the hole transport layer is not provided in this modification. That is, the electrode layers 42 and 44 forming the second electrode 40 are arranged to be connected to the light-emitting layer 24 directly not through the hole transport layer. Instead of the hole transport layer, the electron transport layer or both of the electron transport layer and the hole transport layer may be omitted from provision.

This is also applicable to the other embodiments. Namely, in the first embodiment and the third embodiment described later, at least one of the electron transport layer 22 and the hole transport layer 26 may be provided in the device, or both of them may be omitted from provision.

3. Third Embodiment 3.1 Device Structure

Figure 5:
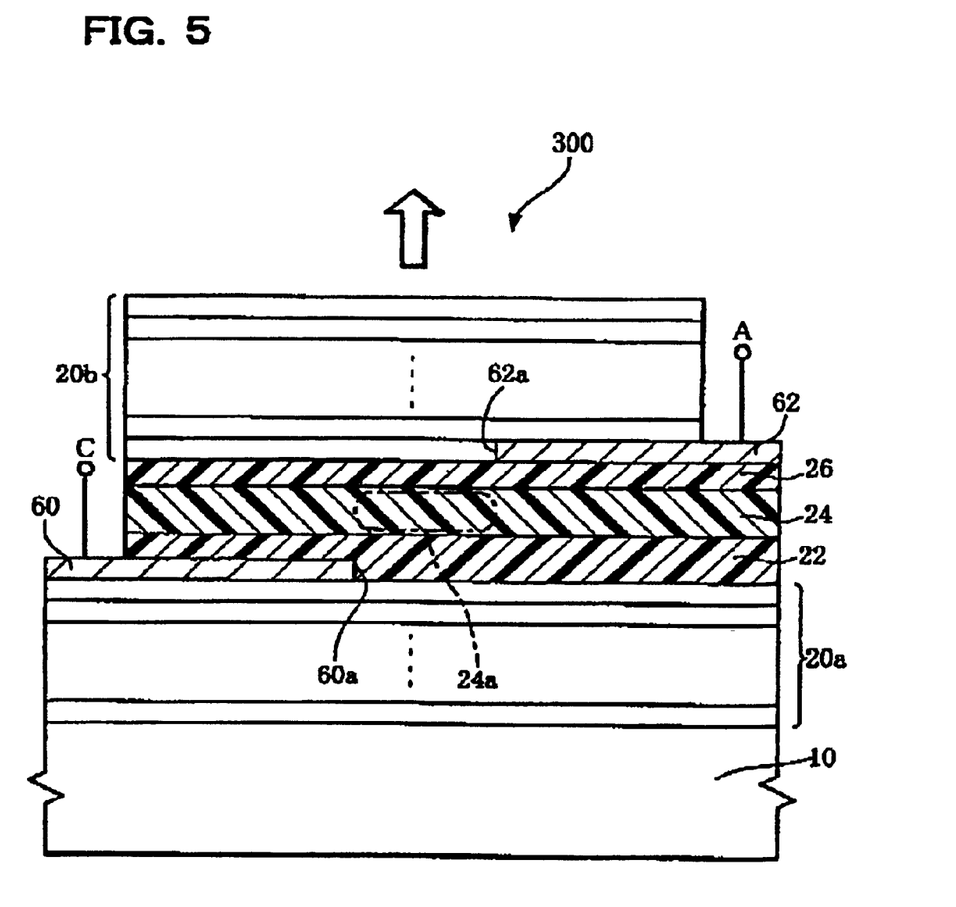
FIG. 5 is a cross-sectional view schematically showing a light emitting device according to the third embodiment of the present invention.

FIG. 5 is a cross-sectional view schematically showing a light emitting device 300 according to the third embodiment of the present invention. The structure of the first and second electrodes in this embodiment is different from those of the first and second embodiments. The description below mainly concentrates on the differences between the first and second embodiments and the third embodiment, and components having substantially the same functions as the components of FIG. 1 are denoted by the same reference numbers.

The light emitting device 300 includes a light-emitting section on a substrate 10. The light-emitting section comprises a first dielectric multi-layered film 20a, an electron transport layer 22, a light-emitting layer 24, a hole transport layer 26 and a second dielectric multi-layered film 20b, which are piled in order.

The first dielectric multi-layered film 20a is provided thereon with a cathode 60 connected to the electrode transport layer 22. The hole transport layer 26 is provided thereon with an anode 62 connected to the hole transport layer 26. The cathode 60 and the anode 62 are disposed so as not to overlap a light-emitting region 24a of the light-emitting layer 24 in the direction that the light emits, which is shown by an arrow in FIG. 5. More concretely, an end portion 60a of the cathode 60 and an end portion 62a of the anode 62 are spaced each other.

Description of the first and second dielectric multi-layered films 20a and 20b is omitted here since they are same as those of the first embodiment.

3.2 Device Operation and Effects

In the light emitting device 300 in this embodiment of the invention, the light emits in accordance with the following mechanism. That is, applying a predetermined voltage to the cathode 60 and the anode 62 enables electrons to be applied to the electron transport layer 22 as well as holes to be applied to the hole transport layer 22. Thus, excitons are generated by combining in the light-emitting layer 24 the electrons applied to the electron transport layer 22 and the holes applied to the hole transport layer 26, and then, light is generated when the excitons are deactivated.

The light generated in the light-emitting layer 24 is increased in wavelength selectivity through an optical resonator comprising a pair of the dielectric multi-layered films 20a and 20b. As a result, the light generated in the light-emitting layer 24 by means of the electro-luminescence emits at a high efficiency in a narrow wavelength band corresponding to the wavelength of the optical resonator.

Furthermore, in accordance with the light emitting device 300, the cathode 60 and the anode 62 are disposed so as not to overlap the light-emitting region 24a of the light-emitting layer 24 in the direction that the light emits. As a result, the absorption and scattering of the light caused by the cathode 60 and the anode 62 can be reduced, so that the light generated in the light-emitting layer 24 can be utilized at high efficiency.

4. Fourth Embodiment 4.1 Display Device and Electronic Instrument

The light emitting device of the present invention such as the light emitting device 100, 200, 210 and 300 can be applied to a display device 500. The display device 500 having such a light emitting device can be applied to an electronic instrument. FIGS. 6 to 11 are perspective views showing examples of electronic instruments to which the display device 500 having one of the light emitting devices 100, 200, 210 and 300 is applied.

Figure 6:
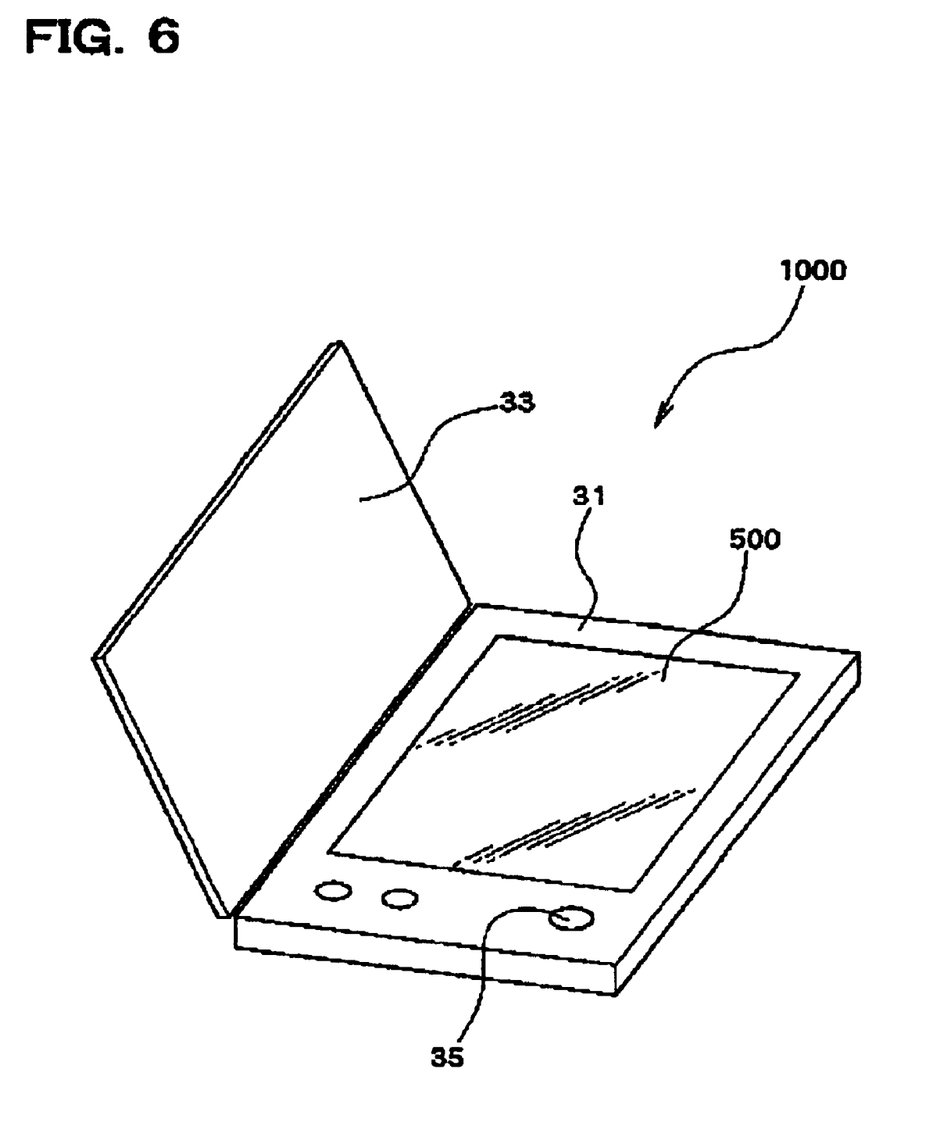
FIG. 6 is a perspective view showing an electronic book as an example of the electronic instruments according to the present invention.

FIG. 6 is a perspective view showing an electronic book 1000 as an example of the electronic instrument according to this embodiment of the present invention. The electronic book 1000 includes a book-shaped frame 32, a cover 33 hinged on the frame to be opened and closed. The display device 500 having an exposed display screen is provided onto the frame 32, and an operating section 35 is also provided. A controller, a counter and a memory (not shown) are provided in the frame 32. The display device according to this embodiment has a pixel portion (not shown) formed by filling a thin element with an electronic ink and a peripheral integrated circuit (not shown) unified with this pixel portion. The peripheral circuit has a decoding type of scan driver and a data driver.

Figure 7:
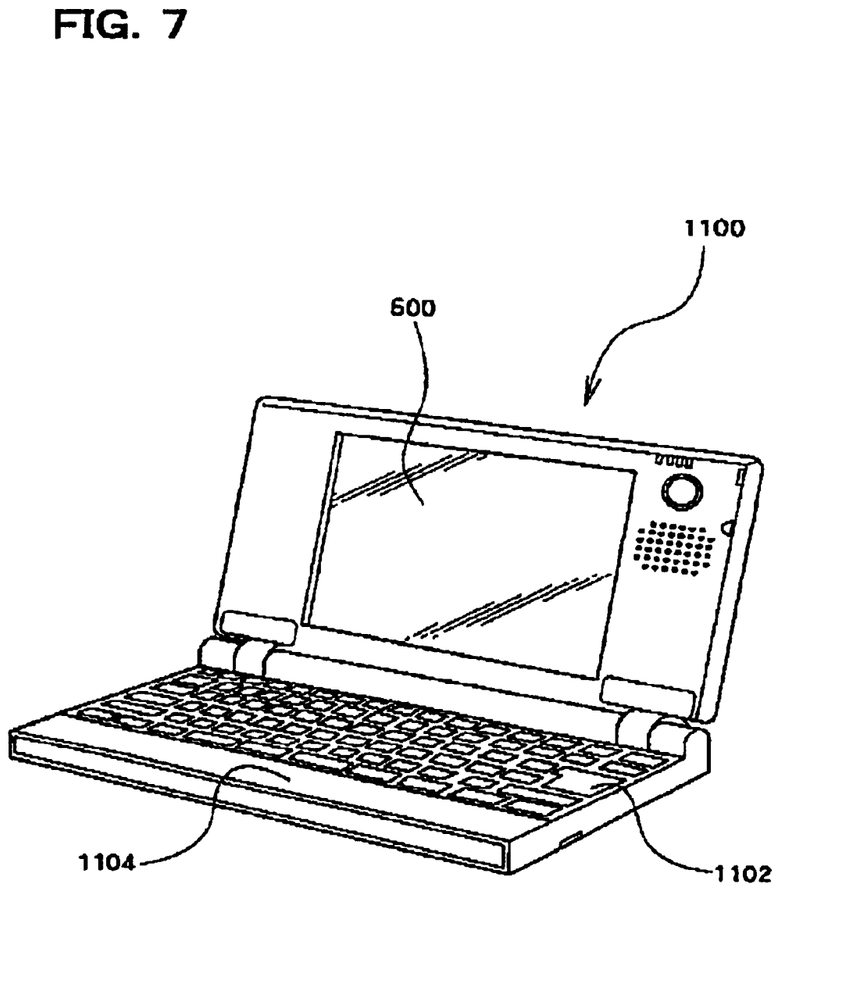
FIG. 7 is a perspective view showing a personal computer as an example of the electronic instruments according to the present invention.

FIG. 7 is a perspective view showing a personal computer 1100 as an example of the electronic instrument according to this embodiment of the invention. The personal computer 1100 includes a main body 1104 having a keyboard 1102, and a display unit having the above-described display device 500.

Figure 8:
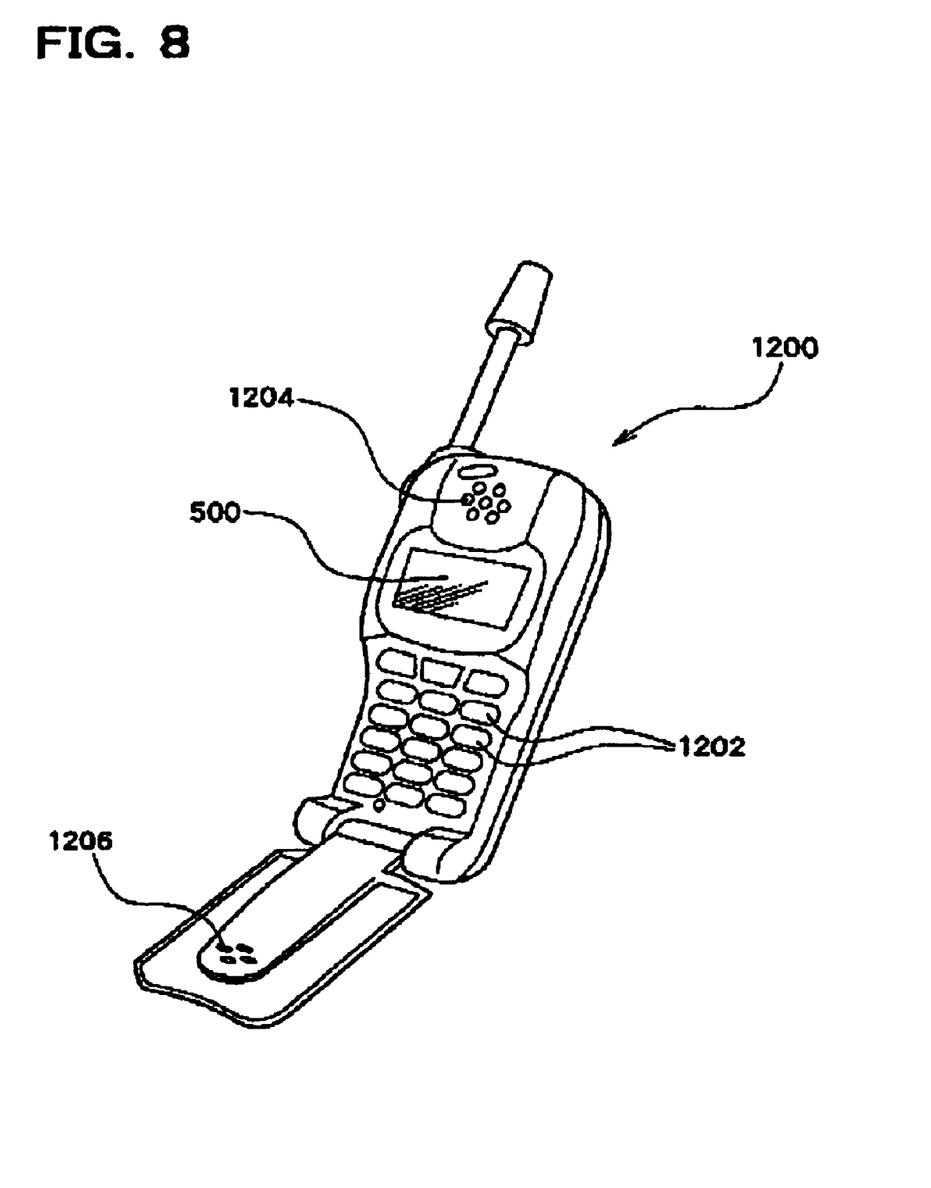
FIG. 8 is a perspective view showing a portable phone as an example of the electronic instruments according to the present invention.

FIG. 8 is a perspective view showing a portable phone 1200 as an example of the electronic instrument according to this embodiment of the invention. The portable phone 1200 includes a plurality of operation buttons, a receiver 1204, a transmitter 1206 and the above display device 500, as shown in FIG. 8.

Figure 9:
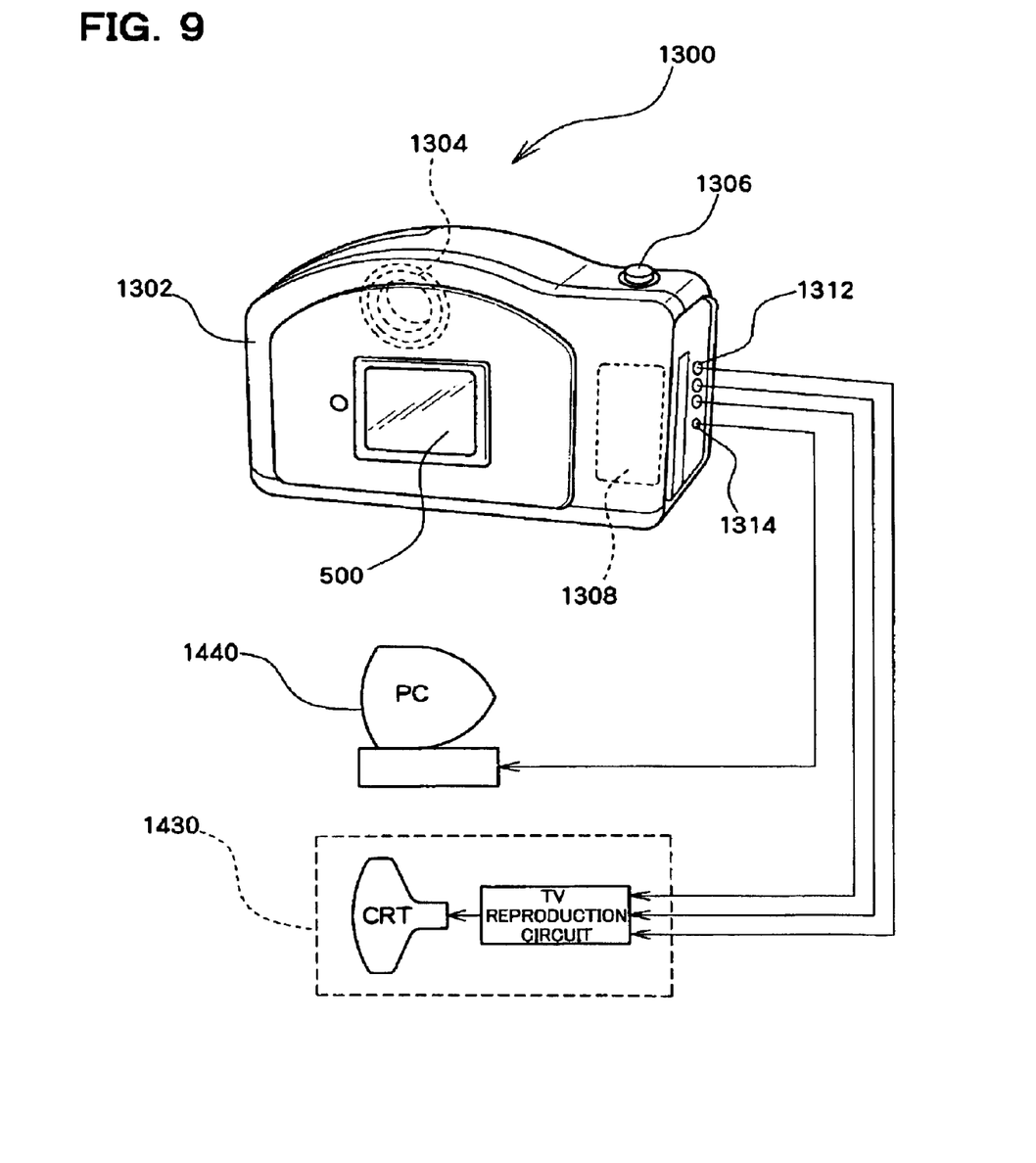
FIG. 9 is a perspective view showing a digital still camera as example of the electronic instruments according to the present invention.

FIG. 9 is a perspective view showing a digital still camera 1300 as an example of the electronic instrument according to this embodiment of the invention. FIG. 9 shows a structure of the digital still camera 1300 and also simply shows a connection between the digital still camera 1300 and external devices.

A photographic camera usually exposes a film by using an optical image of an object, but the digital still camera 1300 conducts electro-optical conversion of an optical image of an object by using CCD and generates an image signal. The above display device 500 is provided on the back side of the digital still camera 1300 and displays an object based on the image signal from CCD. In other words, the display device 500 functions as a finder to display an object. A light receiving unit 1304 including an optical lens, CCD or the like is provided on the viewer side of a case 1302 (or a back side in FIG. 9). If a photographer confirms an object displayed on the display device 500 and depresses a shutter button 1306, the image signal from CCD at that time is transferred and stored into a memory of a circuit board 1308. The digital still camera 1300 also includes a video signal output terminal 1312 and an input/output terminal 1314 for data communication on a side surface of the case 1302. As shown in FIG. 9, a TV monitor 1430 and a personal computer 1440 can be respectively connected to the video signal output terminal 1312 and the input/output terminal 1314, if required. In addition, the image signal stored in the memory of the circuit board 1308 can be output to the TV monitor 1430 or the personal computer 1440 by the predetermined operation.

Figure 10:
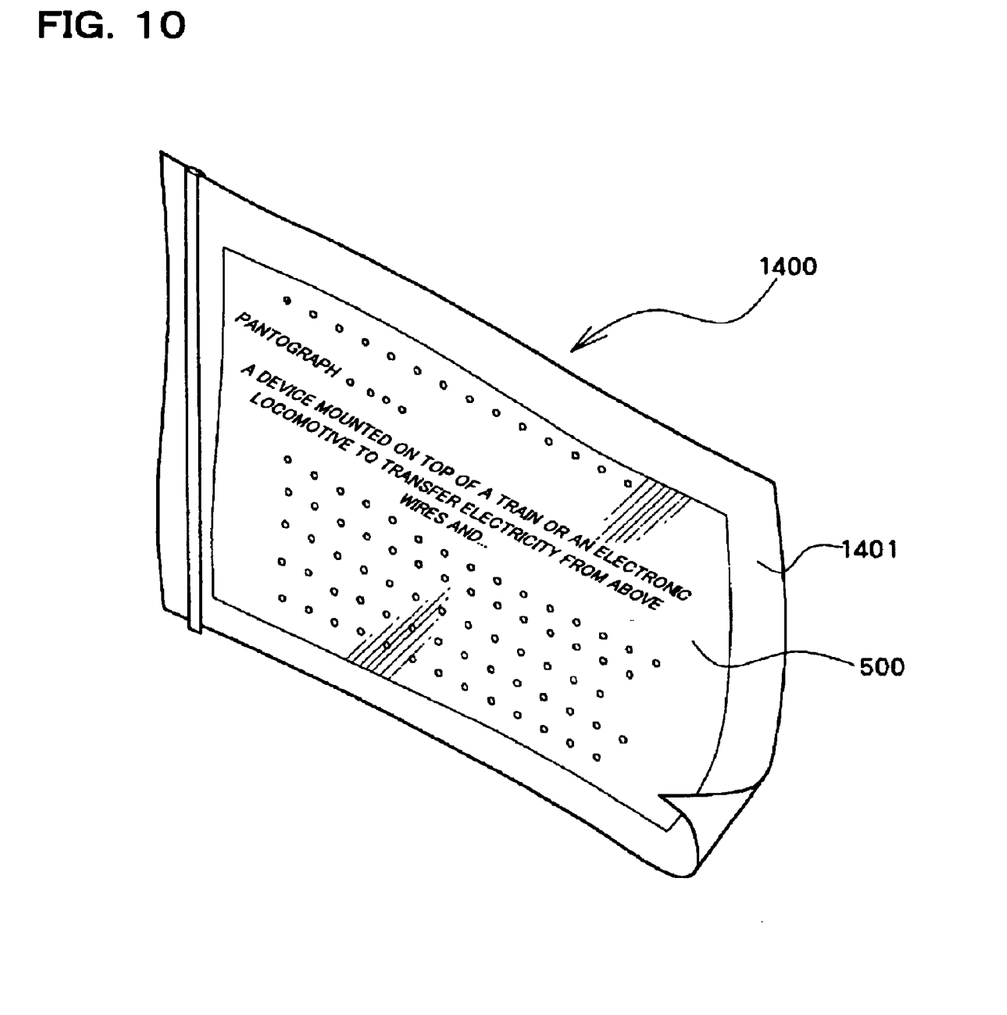
FIG. 10 is a perspective view showing an electronic paper as example of the electronic instruments according to the present invention.

FIG. 10 is a perspective view showing a electronic paper 1400 as an example of the electronic instrument according to this embodiment of the invention. The electronic paper 1400 includes a main component 1401 formed of a rewritable sheet having a feel and flexibility similar to a real paper, and a display unit having the above display device 500, as shown in FIG. 10.

Figure 11:
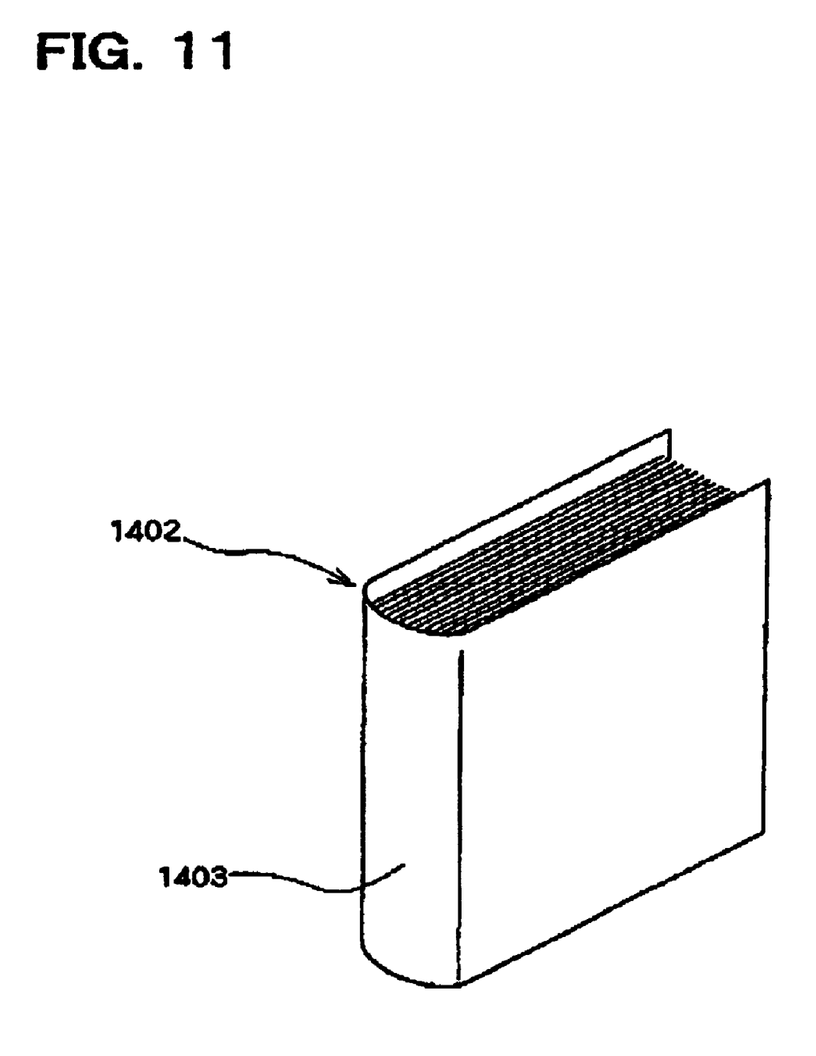
FIG. 11 is a perspective view showing an electronic notebook as example of the electronic instruments according to the present invention.

FIG. 11 is a perspective view showing a electronic notebook 1402 as an example of the electronic instrument according to this embodiment of the invention. The electronic notebook 1402 has a plurality of sheets of the electronic paper 1400 of FIG. 10 bound by a cover 1403, as shown in FIG. 11. The electronic notebook 1402 can change displayed content of the electronic paper 1400 in a bound state by providing a display data input means in the cover 1403.

In addition to these electronic book 1000 of FIG. 6, personal computer 1100 of FIG. 7, portable phone 1200 of FIG. 8, digital still camera 1300 of FIG. 9, electronic paper 1400 of FIG. 10 and electronic notebook 1402 of FIG. 11, it should be noted that various other instruments such as a liquid crystal television, a view-finder or monitor type of video tape recorder, a car navigation device, a pager, an electronic pocket notebook, an electronic calculator, a wordprocessor, a workstation, a TV phone, a POS terminal, an IC card, a mini-disk player, or a device provided with a touch panel can be provided as other examples. It goes without saying that the display device 500 can be used as a display unit of these electronic instruments.

Although the present invention has been described with reference to above described embodiments, the present invention is not limited thereto and various modifications can be made within the scope of the invention.

For example, the dielectric multi-layered films of the light emitting device may comprise not the third and fourth electrodes but other layers. As in the light emitting device according to the second embodiment (see FIG. 3), a projecting portion may be formed in the first and second electrodes used to apply a voltage to the light-emitting layer, enabling to make an electric current concentrate.

What is claimed is:

1. A light emitting device having a substrate and a light-emitting section provided on the substrate, and emitting light in a direction intersecting the substrate, wherein the light-emitting section includes a first side and a second side in a direction parallel to a surface of the substrate, and comprises:

a light-emitting layer in which light is generated by electro-luminescence; an electron transport layer and a hole transport layer with said light-emitting layer sandwiched therebetween;

a first pair of electrode layers used to apply electrons to the light-emitting layer through said electron transport layer, wherein one of the first pair of electrode layers is formed on the first side of the light-emitting section and the other of the first pair of electrode layers is formed on the second side of the light-emitting section; a second pair of electrode layers used to apply holes to the light-emitting layer through said hole transport layer, wherein one of the second pair of electrode layers is formed on the first side of the light-emitting section and the other of the second pair of electrode layers is formed on the second side of the light-emitting section; and first and second dielectric multi-layered films between which the light-emitting layer is interposed, wherein a first gate electrode is disposed in the first dielectric multi-layered film, and a second gate electrode is disposed in the second dielectric multi-layered film, wherein the first and second pairs of electrode layers are disposed to avoid overlap with a light-emitting region in the light-emitting layer, as viewed from the light emitting direction.

2. The light emitting device as defined in claim 1, wherein the first pair of electrode layers are disposed on an upper side of the light-emitting layer and the second pair of electrode layers are disposed on a lower side of the light-emitting layer, in the direction intersecting the substrate.

3. The light emitting device as defined in claim 1, wherein a wavelength band of a light reflected on the first and second dielectric multi-layered films is included in a wavelength band of a light generated in the light-emitting layer.

4. A display device using the light emitting device as defined in claim 1.

5. An electronic instrument using the display device as defined in claim 4.

6. An electronic instrument using the light emitting device as defined in claim 1.

7. A light emitting device comprising:

a substrate;

a light-emitting layer in which light is generated by electro-luminescence;

first and second dielectric multi-layered films between which the light-emitting layer is interposed in a direction intersecting the substrate, wherein a first gate electrode is disposed in the first dielectric multi-layered film, and a second gate electrode is disposed in the second dielectric multi-layered film;

at least a first electric charge transport layer disposed on an upper side of the light-emitting layer and a second electric charge transport layer disposed on a lower side of the light-emitting layer, in the direction intersecting the substrate;

a first pair of electrode layers used to apply first electric charges to the light-emitting layer through said first charge transport layer, wherein one of the first pair of electrode layers is formed on a first side of the light-emitting layer, and the other of the first pair of electrode layers is formed on a second side of the light-emitting layer, in a direction parallel to a surface of the substrate; and a second pair of electrode layers used to apply second electric charges to the light-emitting layer through said second charge transport layer, wherein one of the second pair of electrode layers is formed on the first side of the light-emitting layer and the other of the second pair of electrode layers is formed on the second side of the light-emitting layer, wherein the first and second pairs of electrode layers are disposed to avoid overlap with a light-emitting region in the light-emitting layer, as viewed from a light emitting direction; and wherein the type of said first electric charges is opposite to that of said second electric charges.

* * * * *